Feb. 2, 1965 R. D. CRAWFORD 3,168,711
BEAT-FREQUENCY OSCILLATOR
Filed March 2, 1962
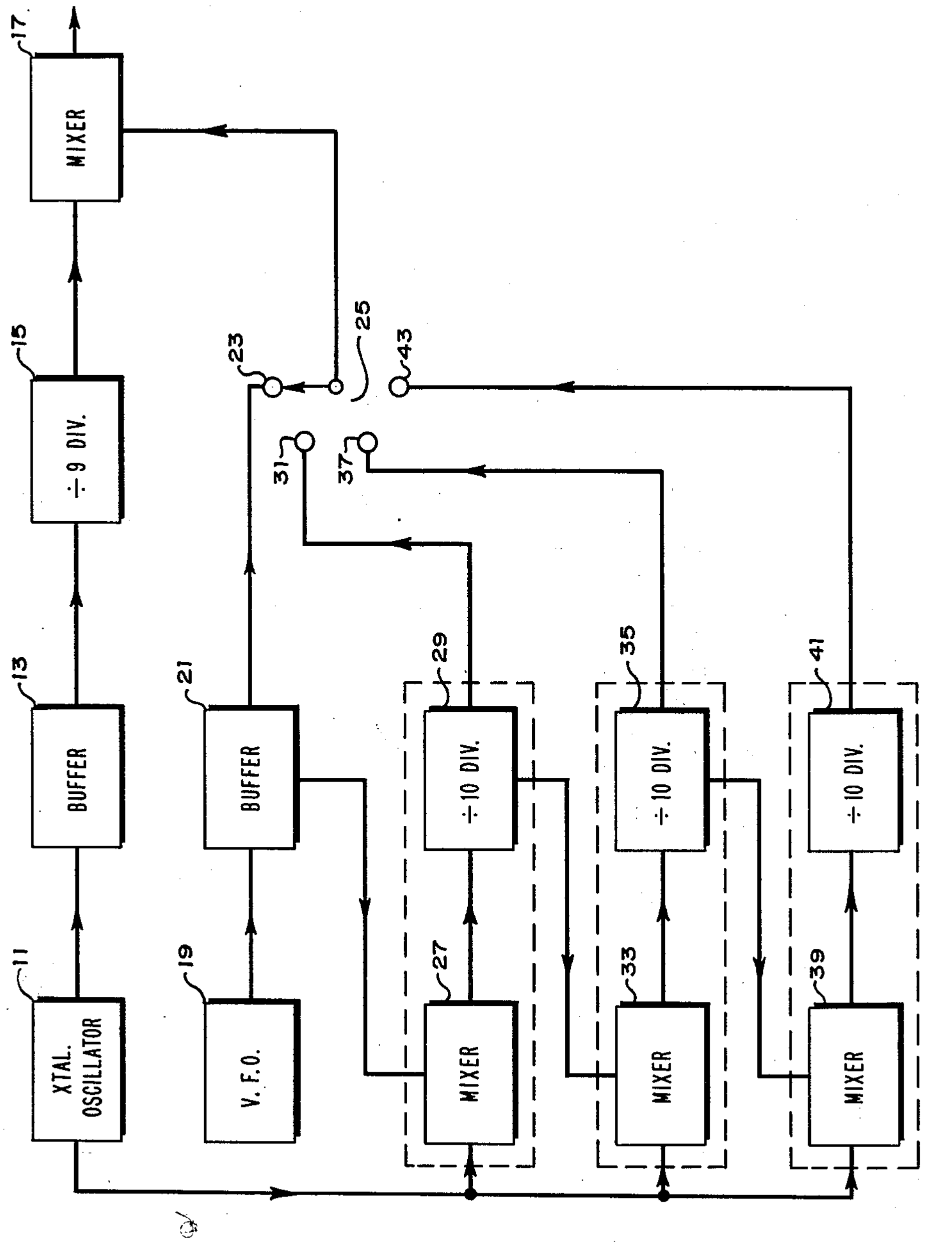
INVENTOR
RICHARD D. CRAWFORD
BY J. C. Chapman
ATTORNEY United States Patent Office 3,168,711
Patented Feb. 2, 1965

3,168,711
BEAT-FREQUENCY OSCILLATOR

Richard David Crawford, Palo Alto, Calif., assignor to Hewlett-Packard Company, Palo Alto, Calif., a corporation of California Filed Mar. 2, 1962, Ser. No. 176,964
4 Claims. (Cl. 331—39)

This invention relates to a multi-range beat-frequency oscillator.

There are many systems in the prior art which show the generation of a fixed frequency from a crystal-controlled oscillator or other accurate source, the multiplication or division of this fixed frequency to obtain a number of harmonically-related fixed frequencies, the selection by means of a range switch of a selected one of these fixed frequencies and its mixing with the output of a variable-frequency oscillator to obtain continuous output-frequency coverage.

It is the principal object of this invention to provide a multi-range beat-frequency oscillator of outstanding simplicity.

It is a further object of this invention to provide a multi-range beat-frequency oscillator in which divider-stages for different ranges operate at frequencies which are so similar that the divider stages can be identical in design.

The drawing shows a block diagram of a beat-frequency oscillator in accordance with this invention.

The beat-frequency oscillator in accordance with this invention is designed to provide output frequencies $\Delta f$ in a plurality of ranges $\Delta f$, $\Delta f/n$, $\Delta f/n^2$, $\Delta f/n^3$ and $\Delta f/n^4$, where $n$ is an integer greater than one. In the specific example shown in the drawing, $n=10$ and the ranges are therefore decades. It comprises a crystal oscillator 11 operating at the frequency $(n\pm1)F$, a buffer amplifier 13 and a $(n\pm1)$ frequency divider 15 the output of which is the frequency F. The purpose of this arrangement is to have two signal sources, one for the frequency $(n\pm1)F$ and one for the frequency F. This purpose could also be accomplished by having an oscillator operating at the frequency F and a $(n\pm1)$ frequency multiplier the output of which would be the frequency $(n\pm1)F$. The frequency division system, however, is preferred over one employing frequency multiplication in order to reduce random incidental phase modulation at the frequency $(n\pm1)$F. The output F of divider 15 is fed to an input terminal of mixer 17. It also comprises a third signal source, namely a variable-frequency oscillator 19 operating at the frequency $F\pm\Delta f$. The output frequency $F\pm\Delta f$ of oscillator 19 is variable to permit the variation of the output frequency $\Delta f$.

The output frequency $F\pm\Delta f$ of oscillator 19 is fed through a buffer amplifier 21 and contact 23 of range switch 25 to another input terminal of mixer 17. The output frequency of mixer 17, with the range switch at position 23, is therefore $F—F\pm\Delta f=\Delta f$.

The output frequency $F\pm\Delta f$ of oscillator 19 is also fed to an input terminal of mixer 27, while the output frequency $(n\pm1)F$ of oscillator 11 is fed to the other input terminal of mixer 27. The output frequency of mixer 27 is $[(n\pm1)F\pm(F\pm\Delta f)]$; it is fed to frequency divider 29 which divides it by the factor $n$ to yield $$F\pm\left(\frac{\Delta f}{n}\right)$$

This $$F\pm\left(\frac{\Delta f}{n}\right)$$

frequency is fed through contact 31 of range switch 25 to an input terminal of mixer 17. Since F is fed to the other input terminal of mixer 17, its output with the range switch at position 31 is $$F-\left[F\pm\left(\frac{\Delta f}{n}\right)\right]=\left(\frac{\Delta f}{n}\right)$$

The output frequency $$F\pm\left(\frac{\Delta f}{n}\right)$$

of divider 29 is fed to a input terminal of mixer 33, while the output frequency $(n\pm1)F$ of oscillator 11 is fed to the other input terminal of mixer 33. The output frequency of mixer 33 is $$\left[\left(n\pm1\right)F\pm\left(F\pm\left(\frac{\Delta f}{n}\right)\right)\right]$$

it is fed to frequency divider 35 which divides it by the factor $n$ to yield $$F\pm\left(\frac{\Delta f}{n^2}\right)$$

This $$F\pm\left(\frac{\Delta f}{n^2}\right)$$

frequency is fed through contact 37 of range switch 25 to an input terminal of mixer 17. Since a signal of frequency F is fed to the other input terminal of mixer 17, its output with the range switch at position 37 is $$F-\left[F\pm\left(\frac{\Delta f}{n^2}\right)\right]=\left(\frac{\Delta f}{n^2}\right)$$

Similarly, the output frequency $$F\pm\left(\frac{\Delta f}{n^2}\right)$$

of divider 35 is fed to an input terminal of mixer 39, while the output frequency $(n\pm1)F$ of oscillator 11 is fed to the other input terminal of mixer 39. The output frequency of mixer 39 is $$\left[\left(n\pm1\right)F\right]\pm\left[F\pm\left(\frac{\Delta f}{n^2}\right)\right]$$

is fed to a frequency divider 41 which divides it by the factor $n$ to yield $$F\pm\left(\frac{\Delta f}{n^3}\right)$$

This $$F\pm\left(\frac{\Delta f}{n^3}\right)$$

frequency is fed through contact 43 of range switch 25 to an input terminal of mixer 17. Since F is fed to the other input terminal of mixer 17, its output with the range switch at position 43 is $$F-\left[F\pm\left(\frac{\Delta f}{n^3}\right)\right]=\left(\frac{\Delta f}{n^3}\right)$$

The beat-frequency oscillator can be provided with several more stages to provide $$\frac{\Delta f}{n^4}, \frac{\Delta f}{n^5}$$

etc. In each instance the mixer of a given stage is fed with the output of oscillator 11 and with the output of the $n$-divider of the preceding stage. The output of that mixer is divided by $n$ and fed to a contact of range switch 25.

The principal advantage of the beat-frequency oscillator of this invention is that the mixer-divider combinations 27–29, 33–35, 39–41, etc. operate at frequencies which are so nearly the same that these circuits can be identical modules.

For instance, in a typical application, the beat-frequency oscillator is designed to provide output frequencies of 60 kilocycles per second down to .005 cycle per second in seven over-lapping decade ranges as follows:

60—5 kilocycles per second
6,000—500 cycles per second
600—50 cycles per second
60—5 cycles per second
6—.5 cycle per second
.6—.05 cycle per second
.06—.005 cycle per second The frequency, $(n-1)F$, of crystal oscillator 11 is 5 megacycles. Since the ranges are in decades $(n=10)$, the output of divider 15 divides the 5 megacycles by 9 so that the frequency F is 555.555– – – kilocycles. The variable frequency oscillator 19 operates from 495.555– – – to 550.555– – – kilocycles. With the output of oscillator 19 set at 550.555– – – kilocycles, the signals applied to the input terminals of mixer 27 are 5 megacycles and 550.555– – – kilocycles; the signals applied to the input terminals of mixer 33 are 5 megacycles and 555.055– – – kilocycles; the signals applied to the input terminals of mixer 39 are 5 megacycles and 555.505– – – kilocycles. As this process is repeated in three more stages, the 5 magacycle signal remains the same and the other signals applied to the mixers become, in succession, 555.5505– – – kilocycles, 555.55505– – – kilocycles, and 555.555505– – – kilocycles. Thus it will be apparent that the mixers and dividers of the six stages can be made of identical and interchangeable modules. Successively more stages can be added in order to extend the frequency range downward as far as desired.

I claim:

1. A beat-frequency oscillator designed to produce output frequencies of $\Delta f$, $\Delta f/n$, $\Delta f/n^2$ and $\Delta f/n^3$, where $n$ is an integer greater than one, and comprising:

a first signal source operating at the frequency $(n\pm1)F$, a second signal source connected to said first signal source and designed to produce the frequency F, a third signal source operating at the frequency $F\pm\Delta f$, output mixing means to mix the output F of said second signal source with the output $F\pm\Delta f$ of said third signal source to obtain the frequency $\Delta f$, mixing means to mix the output $(n\pm1)F$ of said first signal source with the output $F\pm\Delta f$ of said third signal source to obtain the frequency $[(n\pm1)F\pm(F\pm\Delta f)]$, a first frequency divider connected to said last-named mixing means and designed to divide the $[(n\pm1)F\pm(F\pm\Delta f)]$ frequency by $n$ to obtain the frequency $$F\pm\frac{\Delta f}{n}$$

output mixing means to mix the output F of said second signal source with the output $$F\pm\frac{\Delta f}{n}$$

of said first frequency divider to obtain the frequency $\Delta f/n$, mixing means to mix the output $(n\pm1)F$ of said first signal source with the output $$F\pm\frac{\Delta f}{n}$$

of said first frequency divider to obtain the frequency $$\left[\left(n\pm1\right)F\right]\pm\left[F\pm\frac{\Delta f}{n}\right]$$

a second frequency divider connected to said last-named mixing means and designed to divide the $$\left[\left(n\pm1\right)F\right]\pm\left[F\pm\frac{\Delta f}{n}\right]$$

frequency by $n$ to obtain the frequency $$F\pm\frac{\Delta f}{n^2}$$

and output mixing means to mix the output F of said second signal source with the output $$F\pm\frac{\Delta f}{n^2}$$

of said second frequency divider to obtain $$\frac{\Delta f}{n^2}$$

2. A beat-frequency oscillator designed to produce output frequencies of $\Delta f/n$, $\Delta f/n^2$ and $\Delta f/n^3$, where $n$ is an integer greater than one, and comprising:

a first signal source operating at the frequency $(n\pm1)F$, a second signal source connected to said first signal source and designed to produce the frequency F, a third signal source operating at the frequency $F\pm\Delta f$, mixing means to mix the output $(n\pm1)F$ of said first signal source with the output $F\pm\Delta f$ of said third signal source to obtain the frequency $[(n\pm1)F\pm F\pm\Delta f)]$, a first frequency divider connected to said last-named mixing means and designed to divide the $[(n\pm1)F\pm(F\pm\Delta f)]$ frequently by $n$ to obtain the frequency $$F\pm\frac{\Delta f}{n}$$

mixing means to mix the output $(n\pm1)F$ of said first signal source with the output $$F\pm\frac{\Delta f}{n}$$

of said first frequency divider to obtain the frequency $$\left[\left(n\pm1\right)F\right]\pm\left[F\pm\frac{\Delta f}{n}\right]$$

a second frequency divider connected to said last-named mixing means and designed to divide the $$\left[\left(n\pm1\right)F\right]\pm\left[F\pm\frac{\Delta f}{n}\right]$$

frequency by $n$ to obtain the frequency $$F\pm\frac{\Delta f}{n^2}.$$

output mixing means, means to apply to said output mixing means the output F of said second signal source and range selecting means to apply to said output mixing means a frequency selected from the output of one of said frequency dividers.

3. In a beat-frequency oscillator designed to produce output frequencies in a plurality of ranges defined by successive powers of $n$, $n$ being an integer greater than one: means to produce first and second frequencies, said first frequency being exactly $(n\pm1)$ times greater than said second frequency, means to produce a third frequency, a plurality of stages each comprising a mixer and an $n$-divider connected to the output of said mixer, means to apply the output of said first frequency source to an input terminal of each of said mixers, means to apply the output of said third frequency source to the other input terminal of the mixer of the first of said stages, means to apply to the input terminal of the mixer of a succeeding stage the output frequency of the divider of the preceding stage, an output mixer, and means including a range switch to apply to said output mixer said second frequency and another frequency selected from said third frequency and the output of one of the dividers from said stages.

4. In a beat-frequency oscillator designed to produce output frequencies in a plurality of ranges defined by successive powers of *n*, *n* being an integer greater than one: means to produce first and second frequencies, said first frequency being exactly ($n \pm 1$) times greater than said second frequency, means to produce a third frequency, a plurality of stages each comprising a mixer and an *n*-divider connected to the output of said mixer, means to apply the output of said first frequency source to an input terminal of each of said mixers, means to apply the output of said third frequency source to the other input terminal of the mixer of the first of said stages, means to apply to the input terminal of the mixer of a succeeding stage the output frequency of the divider of the preceding stage, an output mixer, and means including a range switch to apply to said output mixer said second frequency and another frequency selected from the output of one of the dividers from said stages.

References Cited by the Examiner

UNITED STATES PATENTS

| | | | |
|---|---|---|---|
| 2,574,326 | 11/51 | Goldstine | 331—38 |
| 2,957,144 | 10/60 | Huhn | 331—51 X |

ROY LAKE, *Primary Examiner.*

JOHN KOMINSKI, *Examiner.*